United States Patent
Zhang et al.

(10) Patent No.: US 6,268,030 B1
(45) Date of Patent: Jul. 31, 2001

(54) SILICON WAFER CARRIER

(75) Inventors: En Lai Zhang; Satoshi Yamamoto; Takayoshi Numata; Kiyoshi Sugie, all of Chiba (JP)

(73) Assignee: Teijin Limited, Osaki (JP)

(*) Notice: Subject to any disclaimer, the term of this patent is extended or adjusted under 35 U.S.C. 154(b) by 0 days.

(21) Appl. No.: 09/147,268

(22) PCT Filed: Apr. 4, 1997

(86) PCT No.: PCT/JP97/01171

§ 371 Date: Nov. 17, 1998

§ 102(e) Date: Nov. 17, 1998

(87) PCT Pub. No.: WO98/45879

PCT Pub. Date: Oct. 15, 1998

(51) Int. Cl.$^7$ .............. B65D 85/30; B65D 1/36; B65D 6/04; C08G 63/12

(52) U.S. Cl. ............ 428/35.7; 528/308; 528/308.6; 206/562; 206/833

(58) Field of Search ............... 528/308.6, 308; 428/35.7; 206/562, 833

(56) References Cited

U.S. PATENT DOCUMENTS

| | | | |
|---|---|---|---|
| 4,818,808 | * | 4/1989 | Kashimoto et al. ......... 528/308.6 |
| 5,652,326 | * | 7/1997 | Ueda et al. .................. 528/288 |
| 5,780,127 | * | 7/1998 | Mikkelsen .................... 428/35.7 |

FOREIGN PATENT DOCUMENTS

| | | |
|---|---|---|
| 62-230835 | 10/1987 | (JP) . |
| 63-120754 | 5/1988 | (JP) . |
| 2-60957 | 3/1990 | (JP) . |
| 3-228349 | 10/1991 | (JP) . |
| 4-276442 | 10/1992 | (JP) . |
| 4-296525 | 10/1992 | (JP) . |
| 8-88266 | 4/1996 | (JP) . |
| 8-288377 | 11/1996 | (JP) . |
| 9-12844 | 1/1997 | (JP) . |
| 9-12845 | 1/1997 | (JP) . |

* cited by examiner

Primary Examiner—Tae Yoon
(74) Attorney, Agent, or Firm—Rader, Fishman & Grauer

(57) ABSTRACT

The present invention relates to a silicon wafer carrier consisting of a composition composed of (a) 100 parts by weight of a polyester, (b) 5 to 100 parts by weight of a polyether ester amide, (c) 10 to 2,500 ppm (based on the polyether ester amide) of an alkaline metal and (d) 0 to 40 parts by weight of a modified polyolefin, generating not more than 10 ppm of volatile gas by the heat-treatment at 150° C. for 60 minutes and eluting not more than 10 ppm of the alkaline metal by the immersion treatment in pure water at 80° C. for 120 minutes. The silicon wafer carrier has the generation of volatile gas and the elution of metal suppressed to an extent not to essentially cause the surface contamination of a silicon wafer and is provided with excellent permanent antistaticity and high mechanical properties and heat-resistance.

2 Claims, No Drawings

SILICON WAFER CARRIER

TECHNICAL FIELD

The present invention relates to a silicon wafer carrier and its production process, more particularly, to a silicon wafer carrier having little surface-staining tendency and permanent antistaticity and its production process.

BACKGROUND ARTS

Polyesters are widely used owing to their excellent moldability, mechanical properties, heat-resistance, chemical resistance, creep resistance, impact resistance, rigidity, etc. Silicon wafers composed of polytetramethylene terephthalate (which may be abbreviated hereafter as PBT) are already in use.

Polyester is easily electrified by rubbing, peeling, etc. Various troubles may take place by the static charge accumulated on a molded article by electrification. For example, accumulated static charge may cause the generation of electric shock in use and the deposition of dust on the surface of the article.

It is known that a polyester can be imparted with antistaticity by the addition of an antistatic agent.

The antistatic treatment by the addition of an antistatic agent can be carried out by coating or internal addition. The coating process necessitates an additional step and, accordingly, the internal addition is preferable from the view point of production process.

Kneading of a low-molecular ionic surfactant such as an alkylsulfonic acid salt or an alkylbenzenesulfonic acid salt into a polymer is known as an internal addition process. A process to use a phosphonium salt is disclosed in the JP-A 62-230835 (hereunder, JP-A means "Japanese Unexamined Patent Publication").

Although high initial antistatic effect can be attained by the method using a low-molecular ionic surfactant because of the bleeding of the surfactant on the surface of the molded article, the process has a problem of losing the antistatic effect by the wiping or washing of the article.

A silicon wafer carrier composed of polytetramethylene terephthalate and carbon fiber is disclosed in the JP-A 8-88266 as a silicon wafer carrier having antistaticity, describing that the silicon wafer carrier has static charge dissipating property, i.e. antistaticity and gives little generation of particulate contaminant caused by friction.

A silicon wafer carrier is used after various treating procedures comprising an annealing step to remove the strain of the silicon wafer carrier, a degassing step to remove the residual volatile components, a washing step to remove attached contaminant and a subsequent drying step.

The silicon wafer carrier is used for the transportation and storage of a silicon wafer in the heat-treating step and the washing step of the silicon wafer under various conditions.

A polyether ester amide is known to have good antistaticity, however, the use of the polymer together with other thermoplastic resin causes laminar peeling and the production of a molded article having desirable mechanical properties is difficult.

A polyester composition composed of a polyester, a polyether ester amide and a modified vinyl polymer is disclosed in the JP-A 9-12844 as a composition having excellent impact resistance.

DISCLOSURE OF THE INVENTION

A large amount of volatile gases composed of organic gases are generated during the transportation and storage of a silicon wafer in the case of using a silicon wafer carrier made of conventional polytetramethylene terephthalate (which may be abbreviated as PBT hereafter) resin for the transportation and storage of a silicon wafer, and the generated gases are condensed on the silicon wafer to cause the contamination of the surface of the wafer. In such a case, the surface contamination of the silicon wafer takes place by the transfer of an impurity from the surface of the silicon wafer carrier to the silicon wafer.

Further, metals are dissolved from the silicon wafer carrier in the washing of the silicon wafer and attached to the surface of the silicon wafer to effect the contamination of the silicon wafer surface.

Such contamination causes the defects and the lowering of electrical properties of a semiconductor device using the silicon wafer and gives a silicon wafer having qualities unsuitable for use.

The use of a compatibilizing agent for imparting a silicon wafer carrier with antistaticity improves the compatibility problem, however, the impurity content in the resin composition increases by the addition of a large amount of the compatibilizing agent to cause the problem of surface contamination, etc., in the case of using the resin as a silicon wafer carrier.

An object of the present invention is to provide a silicon wafer carrier having suppressed bleeding tendency of impurities, especially alkali metals, to the surface of the silicon wafer carrier in heat-treatment to a level not to cause the trouble of the surface contamination of a silicon wafer and, furthermore, having excellent permanent antistaticity.

Another object of the present invention is to provide a silicon wafer carrier having an impurity bleeding tendency suppressed to an extent not to cause the trouble of the surface contamination of a silicon wafer and exhibiting excellent permanent antistaticity, wherein said permanent antistaticity is characterized by the surface resistivity of $1 \times 10^{14}$ to $1 \times 10^{11}$ $\Omega/\square$ (measuring voltage: 500V).

Another object of the present invention is to provide a silicon wafer carrier having especially low bleeding of impurities and generation of volatile gases.

Another object of the present invention is to provide a silicon wafer carrier having hydrolysis resistance as well as the above characteristics.

Another object of the present invention is to provide a process for producing the silicon wafer carrier having the above properties.

Another object of the present invention is to provide a process for producing the silicon wafer carrier while suppressing the Barus effect occurring in the case of kneading a polyether ester amide with a polyester in molten state and improving the productivity of a silicon wafer carrier compounded with a large amount of a polyether ester amide.

The other object and advantage of the present invention will be clarified by the following explanations.

The present invention comprises the following constitution.

1. A silicon wafer carrier consisting of a composition composed of (a) 100 parts by weight of a polyester, (b) 5 to 100 parts by weight of a polyether ester amide. (c) 10 to 2,500 ppm (based on the polyether ester amide) of an alkaline metal and (d) 0 to 40 parts by weight of a modified polyolefin, generating not more than 10 ppm of volatile gas by the heat-treatment at 150° C. for 60 minutes, and eluting not more than 10 ppm of the alkaline metal by the immersion in pure water at 80° C. for 120 minutes:

2. A silicon wafer carrier consisting of a composition composed of (a) 100 parts by weight of a polyester, (b) 5 to 30 parts by weight of a polyether ester amide and (c) 10 to 2,500 ppm (based on the polyether ester amide) of an alkaline metal, containing a polyether ester amide phase having an aspect ratio of 3 or more, a minor diameter of 1 µm or less and a major diameter of 1 µm or more in a polyester phase in the range from the surface of the silicon wafer carrier to the depth of 20 µm, generating not more than 10 ppm of volatile gas by the heat-treatment at 150° C. for 60 minutes, and eluting not more than 10 ppm of the alkaline metal by the immersion in pure water at 80° C. for 120 minutes:

3. A silicon wafer carrier consisting of a composition composed of (a) 100 parts by weight of a polyester, (b) 31 to 100 parts by weight of a polyether ester amide, (c) 10 to 2,500 ppm (based on the polyether ester amide) of an alkaline metal and (d) 1 to 40 parts by weight of a modified polyolefin, containing a polyether ester amide phase having an aspect ratio of 3 or more, a minor diameter of 1 µm or less and a major diameter of 1 µm or more in a polyester phase in the range from the surface of the silicon wafer carrier to the depth of 20 µm, generating not more than 10 ppm of volatile gas by the heat-treatment at 150° C. for 60 minutes, and eluting not more than 10 ppm of the alkaline metal by the immersion in pure water at 80° C. for 120 minutes:

4. A silicon wafer carrier consisting exclusively of a polytetramethylene terephthalate, generating not more than 10 ppm of volatile gas by the heat-treatment at 150° C. for 60 minutes, and eluting not more than 50 ppb of the alkaline metal by the immersion in pure water at 80° C. for 120 minutes: and 5. A process for producing a silicon wafer carrier described in the item 1, characterized by molding (a) a polyester having an intrinsic viscosity of from 0.6 to 1.2 and (b) a polyether ester amide having a melt viscosity of 10 to 1,000 Pa·S measured at 260° C. and a shear rate of 1,000 sec$^{-1}$ under a molding condition while keeping the melt viscosity ratio of the polyether ester amide (b) to the polyester (a) between 0.01 and 1.

The present invention is described in details as follows.

Polyester

The polyester of the component (a) to be used in the present invention is an aromatic polyester produced by using terephthalic acid or 2,6-naphthalenedicarboxylic acid as an acid component and an aliphatic diol such as ethylene glycol, trimethylene glycol, tetramethylene glycol, hexamethylene glycol and neopentyl glycol as a diol component.

The polyester (a) may be copolymerized with not more than 30 mol %, preferably not more than 20 mol %, more preferably not more than 10 mol % of a copolymerization component based on the total carboxylic acid component.

The polyester (a) is preferably polytetramethylene terephthalate, polypropylene terephthalate, polyethylene terephthalate or polytetramethylene 2,6-naphthalate, especially preferably polytetramethylene terephthalate having high crystallization rate.

The polyester (a) may be a copolymerized polyester produced by substituting a part of the above polyester with a copolymerization component.

Examples of the acid components of such copolymerization component are isophthalic acid, phthalic acid; alkyl-substituted phthalic acids such as methylterephthalic acid and methylisophthalic acid; naphthalenedicarboxylic acids such as 2,6-naphthalenedicarboxylic acid, 2,7-naphthalenedicarboxylic acid and 1,5-naphthalenedicarboxylic acid; diphenyldicarboxylic acids such as 4,4'-diphenyldicarboxylic acid and 3,4'-diphenyldicarboxylic acid; aromatic dicarboxylic acids such as 4,4'-diphenoxyethane dicarboxylic acid and diphenoxyethane dicarboxylic acid; aliphatic or alicyclic dicarboxylic acids such as succinic acid, adipic acid, sebacic acid, azelaic acid, decanedicarboxylic acid and cyclohexanedicarboxylic acid; and oxycarboxylic acids such as ε-oxycapronic acid, hydroxybenzoic acid and hydroxyethoxybenzoic acid.

Examples of the diol components of such copolymerization component are alicyclic diols such as 1,4-cyclohexanedimethanol; dihydroxybenzenes such as hydroquinone and resorcinol; bisphenols such as 2,2-bis(4-hydroxyphenyl)-propane and bis(4-hydroxyphenyl)-sulfone; and aromatic diols such as ether diol derived from a bisphenol and a glycol such as ethylene glycol.

The polyester (a) may contain not more than 1.0 mol %, preferably not more than 0.5 mol %, more preferably not more than 0.3 mol % of a branching component as the copolymerization component.

Examples of such branching component are polyfunctional ester-forming acids such as trimesic acid and trimellitic acid; and polyfunctional ester-forming alcohols such as glycerol, trimethylolpropane and pentaerythritol.

The polyester used in the present invention preferably has an intrinsic viscosity of from 0.6 to 1.20. A polyester having the intrinsic viscosity falling within the above range has a flowability sufficient for molding and gives a molded silicon wafer carrier having high rigidity. A large-sized carrier, e.g. a carrier for a wafer of 12 inch in diameter can be produced without generating short-shot. The intrinsic viscosity is a calculated value based on the value measured in o-chlorophenol at 35° C.

The polyester used in the present invention has a terminal carboxyl concentration of preferably 10 equivalent/ton or less, more preferably 5 equivalent/ton or less when the polyester is not used in combination with a polyether ester amide. The unit "ton" means $10^6$ g. When the terminal carboxyl concentration is within the above range, the obtained silicon wafer carrier has sufficiently low generation of volatile gas in heat-treatment and excellent hydrolysis resistance.

The concentration of the terminal carboxyl group (COOH) is the number of equivalent per $10^6$ g of polymer measured by the A.Conix method [Makromol. Chem. 26, 226(1958)].

The polyester to be used in the present invention is preferably produced by a solid phase polymerization of one or more steps.

The polyester to be used in the present invention can be produced by carrying out the liquid-phase polycondensation of a dicarboxylic acid composed mainly of terephthalic acid or its ester-forming derivative with a dihydroxy compound composed mainly of tetramethylene glycol or its ester-forming derivative in the presence of a catalyst, pelletizing the product and subjecting the pellet to solid-phase polycondensation reaction in nitrogen atmosphere at 180 to 225° C. under normal pressure for 2 to 24 hours.

Polyether Ester Amide

The polyether ester amide of the component (b) to be used in the present invention is the one derived from (b1) a polyamide having carboxyl groups at both terminals and (b2) an alkylene oxide adduct of a bisphenol.

The polyamide (b1) constituting the polyether ester amide (b) of the present invention and having carboxyl groups at both terminals is (1) a ring-opened lactam polymer, (2) a polycondensation product of an aminocarboxylic acid or (3) a polycondensation product of a dicarboxylic acid and a diamine. Examples of the lactam of the polymer (1) are caprolactam, enantholactam, laurolactam and undecanolactam; the examples of the aminocarboxylic acid of the polymer (2) is ω-aminocaproic acid, ω-aminoenanthic acid, ω-aminocaprylic acid, ω-aminopelargonic acid, ω-aminocapric acid, 11-aminoundecanoic acid and 12-aminododecanoic acid; examples of the dicarboxylic acid of the polymer (3) are adipic acid, azelaic acid, sebacic acid, undecane diacid, dodecane diacid and isophthalic acid; and the examples of the diamine are hexamethylenediamine, heptamethylenediamine, octamethylenediamine and decamethylene-diamine. Two or more kinds of the above exemplified amide-forming monomers may be used in combination. Preferable monomers among the above examples are caprolactam, 12-aminododecanoic acid and adipic acid-hexamethylenediamine, especially preferably caprolactam.

The polyamide (b1) can be produced by the ring-opening polymerization or polycondensation of the above amide-forming monomer by conventional method in the presence of a dicarboxylic acid component having a carbon number of from 4 to 20 as a molecular weight controlling agent. Examples of the dicarboxylic acid having a carbon number of from 4 to 20 are aliphatic dicarboxylic acids such as succinic acid, glutaric acid, adipic acid, pimelic acid, suberic acid, azelaic acid, sebacic acid, undecane diacid and dodecane diacid; aromatic dicarboxylic acids such as terephthalic acid, isophthalic acid, phthalic acid and naphthalenedicarboxylic acid; alicyclic dicarboxylic acids such as 1,4-cyclohexanedicarboxylic acid and dicyclohexyl-4,4'-dicarboxylic acid; and alkaline metal salts of 3-sulfoisophthalic acid such as sodium 3-sulfoisophthalate and potassium 3-sulfoisophthalate. Preferable acids among the above examples are aliphatic dicarboxylic acids, aromatic dicarboxylic acids and alkaline metal salts of 3-sulfoisophthalic acid, and especially preferable acids are adipic acid, sebacic acid, terephthalic acid, isophthalic acid and sodium 3-sulfoisophthalate.

The number-average molecular weight of the polyamide (b1) is 500 to 5,000, preferably 500 to 3,000. When the number-average molecular weight of the polyamide (b1) is smaller than 500, the heat-resistance of the polyether ester amide is lowered, and if it exceeds 5,000, the reactivity is lowered to necessitate a long time for the production of the polyether ester amide.

Examples of the bisphenols of the alkylene oxide adduct of a bisphenol (b2) which is another component constituting the polymer (b) are bisphenol A (4,4'-dihydroxydiphenyl-2,2-propane), bisphenol F (4,4'-dihydroxydiphenylmethane), bisphenol S (4,4'-dihydroxydiphenylsulfone) and 4,4'-dihydroxydiphenyl-2,2-butane; and especially preferable compound among the above examples is bisphenol A. The alkylene oxides of the adduct (b2) are ethylene oxide, propylene oxide, 1,2- or 1,4-butylene oxide or a mixture of two or more of the above compounds. Ethylene oxide is preferable among the above examples.

, The number-average molecular weight of the ethylene oxide adduct (b2) of bisphenol is usually 300 to 5,000, preferably 1,000 to 3,000, especially preferably 1,600 to 3,000. More preferably, the adduct has an ethylene oxide molar number of 30 to 60. When the number-average molecular weight is smaller than 300, the antistaticity becomes insufficient, and if it exceeds 5,000, the reactivity is lowered to necessitate a long time for the production of the polyether ester amide.

The polyether ester amide to be used in the present invention as the component (b) is preferably a polyether ester amide derived from a polyamide having carboxyl groups on both terminals and a polyether component consisting of an ethylene oxide adduct of a bisphenol having high molecular weight, especially preferably a polyether ester amide derived from an ethylene oxide adduct of bisphenol having an ethylene oxide molar number of 30 to 60.

The amount of the alkylene oxide adduct (b2) in the component (b) is preferably 20 to 80% by weight, especially preferably 25 to 75% by weight based on the sum of (b1) and (b2). When the amount of (b2) is smaller than 20% by weight, the antistaticity of the component (b) is deteriorated, and when it exceeds 80% by weight, the heat-resistance of the component (b) is lowered to an undesirable level.

There is no particular restriction on the process for the production of the component (b), and the following processes ① and ② can be shown as examples.

Process ①: An amide-forming monomer is made to react with a dicarboxylic acid to form a polyamide (b1), an alkylene oxide adduct (b2) is added thereto and the components are polymerized at high temperature under reduced pressure.

Process ②: An amide-forming monomer, a dicarboxylic acid and the component (b2) are charged into a reactor at the same time, the components are reacted with each other at a high temperature under pressure in the presence or absence of water to produce a polyamide (b1) as an intermediate and the polymerization reaction of (b1) with (b2) is carried out under reduced pressure.

The above polymerization reaction is carried out usually by using a conventional esterification catalyst. Examples of the catalyst are antimony-based catalysts such as antimony trioxide, tin-based catalysts such as monobutyltin oxide, titanium-based catalysts such as tetrabutyl titanate, zirconium-based catalysts such as tetrabutyl zirconate, and metal acetate-based catalysts such as zinc acetate. The amount of the catalyst is usually 0.1 to 5% by weight based on the sum of (b1) and (b2).

The polyether ester amide (b) to be used in the present invention has a melt viscosity of 10 to 1,000 Pa·S measured at 260° C. under a shearing rate of 1,000 sec$^{-1}$, and the melt viscosity ratio of the polyether ester amide (b) to the polyester under the above condition is preferably between 0.01 and 1.

The melt viscosity ratio of a polyester and a polyether ester amide is preferably between 0.01 and 1, more preferably between 0.1 and 1 for developing various characteristics such as permanent antistaticity by the melt-mixing of a polyester and a polyether ester amide having essentially low compatibility and different melt viscosity characteristics. The fine dispersion of the polyether ester amide becomes difficult and the development of antistatic effect is scarcely attainable when the ratio is larger than 1 or smaller than 0.01.

It is surprising that a polyether ester amide (b) having a melt viscosity of 10 to 1,000 (Pa·S) at 260° C. under a shearing rate of 1,000 sec$^{-1}$ and a melt viscosity ratio to the polyester (a) of between 0.01 and 1 can be dispersed in a polyester matrix in a desirable state and the molten mixture exhibits high fluidity in injection molding subjected to high shearing stress. Further surprising fact is that the polyether ester amide is deviated to the surface layer in the filling stage of the resin in a mold to obtain a silicon wafer carrier developing excellent permanent antistaticity in high reproducibility in the case of an injection molding of a silicon wafer carrier with a resin composed of a polyester and a polyether ester amide having melt viscosity values satisfying the above condition.

The amount of the polyether ester amide (b) in the present invention is 5 to 100 parts by weight based on 100 parts by weight of the polyester (a). When the composition is free from modified polyolefin (c), the compounding amount of the polyether ester amide (b) is preferably 5 to 30 parts by weight, more preferably 10 to 20 parts by weight based on 100 parts by weight of the polyester (a). In the case that the composition contains the modified polyolefin (c), the amount of the polyether ester amide (b) is preferably 31 to 100 parts by weight based on 100 parts by weight of the polyester (a).

A sufficient permanent antistaticity cannot be imparted when the amount of the polyether ester amide is smaller than the lower limit of the above range and the mechanical strength and productivity are lowered to undesirable levels when the amount is larger than the above range.

Alkaline Metal

The alkaline metal (c) in the present invention is an element belonging to the group Ia alkali metal or group IIa alkaline earth metal of the periodic table; concretely, lithium, sodium, potassium, rubidium, cesium, francium, beryllium, magnesium, calcium, strontium, barium or radium. These elements may be used in combination. The alkaline metal is preferably present in the composition by adding the metal in the form of an alkaline metal compound.

Examples of the alkaline metal compound are hydroxide, inorganic acid salt and organic acid salt such as acetate, carbonate and ammonium salt. These compounds may be used in combination. Concrete examples of the compound are lithium hydroxide, sodium hydroxide, potassium hydroxide, rubidium hydroxide, cesium hydroxide, francium hydroxide, beryllium hydroxide, magnesium hydroxide, calcium hydroxide, strontium hydroxide, barium hydroxide, radium hydroxide; lithium acetate, sodium acetate, potassium acetate, magnesium acetate, calcium acetate; lithium carbonate, sodium carbonate, and potassium carbonate.

The compounding amount of the alkaline metal (c) is preferably 10 to 2,500 ppm, more preferably 200 to 2,500 ppm based on the polyether ester amide. The antistatic effect is insufficient when the amount is less than 10 ppm, and the amount of alkaline metal eluted in the use of a silicon wafer carrier increases to fail in the use of the resin as a silicon wafer carrier when the compounding amount exceeds 2,500 ppm.

Modified Polyolefin

The modified polyolefin (d) in the present invention is a copolymer produced by the copolymerization of an unsaturated epoxy compound (d1) and one or more kinds of ethylenic unsaturated compounds (d2).

The modified polyolefin (d) contains the unsaturated epoxy compound (d1) as a copolymerization component in an amount of 0.1 to 50% by weight, preferably 1 to 30% by weight.

The unsaturated epoxy compound (d1) is a compound having an epoxy group and an unsaturated group copolymerizable with an ethylenic unsaturated compound in the molecule; for example, an unsaturated glycidyl ester and an unsaturated glycidyl ether expressed by the following general formulas (1) and (2), respectively.

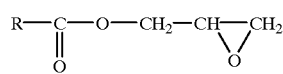
(1)

in the above general formula (1), R is a hydrocarbon group having a carbon number of from 2 to 18 and containing an ethylenic unsaturated bond.

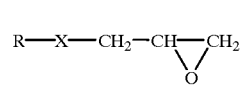
(2)

in the above general formula (2), R is a hydrocarbon group having a carbon number of from 2 to 18 and containing an ethylenic unsaturated bond, and X is —$CH_2$—O— or

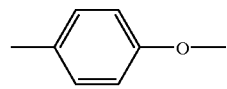

Concrete examples of the unsaturated epoxy compound (d1) are glycidyl acrylate, glycidyl methacrylate, itaconic acid glycidyl ester, allyl glycidyl ether, 2-methylallyl glycidyl ether and styrene-p-glycidyl ether.

The ethylenic unsaturated compound (d2) is, for example, olefins, vinyl esters of a saturated carboxylic acid having a carbon number of from 2 to 6, esters of a saturated alcohol component having a carbon number of from 1 to 8 and an acid, vinyl halides, styrenes, nitriles, vinyl ethers and acrylamides. The acid of the ester of a saturated alcohol having a carbon number of from 1 to 8 and an acid is, for example, acrylic acid, methacrylic acid, maleic acid, and fumaric acid.

Concrete examples of the ethylenic unsaturated compound (d2) are ethylene, propylene, 1-butene, vinyl acetate, methyl acrylate, ethyl acrylate, methyl methacrylate, diethyl maleate, diethyl fumarate, vinyl chloride, vinylidene chloride, styrene, acrylonitrile, isobutyl vinyl ether and acrylamide, preferably ethylene, vinyl acetate and methyl acrylate.

The modified polyolefin can be produced by various methods including a random copolymerization to introduce an unsaturated epoxy compound into the main chain of a copolymer and a graft copolymerization to introduce an unsaturated epoxy compound as a side chain of a copolymer.

The amount of the modified polyolefin used as the component (d) in the present invention is preferably 1 to 40 parts by weight, more preferably 3 to 10 parts by weight based on 100 parts by weight of the polyester (a). The use of less than 1 part by weight of the modified polyolefin gives insufficient effect to suppress the Barus effect in extrusion and improve the productivity and, on the contrary, a composition containing more than 40 parts by weight of the modified polyolefin has a mechanical strength lowered to an undesirable level.

Silicon Wafer Carrier

The silicon wafer carrier of the present invention preferably contains a polyether ester amide phase having an aspect ratio of 3 or above, a minor diameter of 1 μm or less and a major diameter of 1 μm or more in a polyester phase within the range from the surface of the silicon wafer carrier to a depth of 20 μm. The polyether ester amide phase has its major axis directed parallel to the surface of the silicon wafer carrier. Preferably, the polyether ester amide phases are brought into contact with each other or present close to each other at a distance of 0.5 μm or less for getting excellent antistaticity.

Good antistaticity cannot be attained when the aspect ratio of the polyether ester amide phase is smaller than 3. It is also unattainable when the minor diameter of the polyether ester amide phase exceeds 1 μm or the major diameter of the phase is shorter than 1 μm.

The silicon wafer carrier of the present invention has a permanent antistaticity corresponding to a surface resistivity of $1\times10^{14}$ to $1\times10^{11}$ $\Omega/\square$, preferably $1\times10^{13}$ to $1\times10^{11}$ $\Omega/\square$, more preferably $1\times10^{12}$ to $1\times10^{11}$ $\Omega/\square$. An antistaticity sufficient for a silicon wafer carrier can be attained when the surface resistivity is within the above range.

The amount of volatile gas generated by heating the silicon wafer carrier of the present invention at 150° C. for 60 minutes should be 10 ppm or below, preferably 5 ppm or below.

The amount of volatile gas generated from the silicon wafer carrier is determined by head-space gas chromatography on 10 grams of a specimen produced by crushing a silicon wafer carrier to flakes of 5 mm square.

When the generation of volatile gas exceeds 10 ppm, the surface contamination of a silicon wafer with the volatile gas deteriorates the quality of the silicon wafer resulting in the defects of electronic devices such as LSI manufactured by processing the silicon wafer.

The volatile gases generated by the heat-treatment of a silicon wafer carrier are mainly organic gases such as acetaldehyde, acetone, tetrahydrofuran and 3-buten-1-ol. These volatile gases are condensed on a silicon wafer or transferred to a silicon wafer after condensed on the silicon wafer carrier to cause the contamination of the surface of the silicon wafer.

The amount of alkaline metal eluted by immersing the silicon wafer carrier of the present invention in pure water at 80° C. for 120 minutes is required to be 10 ppm or below, preferably 50 ppb or below, especially preferably 10 ppb or below.

The amount of alkaline metal eluted from a silicon wafer carrier is determined by crushing a silicon wafer carrier to flakes of 5 mm square, immersing 10 g of the obtained specimen in 80 ml of pure water at 80° C. for 120 minutes, and measuring the amount of alkaline metal eluted in the pure water with an atomic absorption photometer.

When the elution of alkaline metal exceeds 10 ppm, the surface contamination of a silicon wafer with the alkaline metal deteriorates the quality of the silicon wafer resulting in the defects of electronic devices such as LSI manufactured by processing the silicon wafer.

The elution amount of alkaline metal is 50 ppb or less, preferably 10 ppb or less when the silicon wafer carrier is free from antistaticity. When the elution amount of alkaline metal is within the above range, there is essentially no surface contamination of silicon wafer with alkaline metal and the elution does not cause the defect of electronic devices such as LSI manufactured by processing the silicon wafer.

The surface contamination of a silicon wafer with an alkaline metal is caused by the deposition of the alkaline metal eluted from a silicon wafer carrier on the silicon wafer mainly in a silicon wafer washing process.

When the silicon wafer carrier of the present invention is free from polyether ester amide, i.e. composed exclusively of polytetramethylene terephthalate, the generation of volatile gas should be 10 ppm or below and the elution of alkaline metal should be 50 ppb or below. It is shown before that these conditions are necessary to be satisfied for a silicon wafer carrier crushed to flakes of 5 mm square, and such a silicon wafer carrier can be produced by molding polyester pellets generating not more than 10 ppm, preferably not more than 5 ppm of volatile gas in the case of heat-treatment at 150° C. for 60 minutes in the form of pellets and eluting not more than 50 ppb, preferably not more than 10 ppb of alkaline metal in the case of immersing the pellets in pure water at 80° C. for 120 minutes. The amounts of generated volatile gas and eluted alkaline metal of the pellets are measured by the methods similar to the measurements on the crushed silicon wafer carrier.

Additives

The resin composition to be used in the present invention may be incorporated, within a range not to deteriorate the object of the present invention, with additives such as a fibrous reinforcing agent represented by glass fiber, a particulate or flaky filler, a flame-retardant, a mold-releasing agent, a lubricant, a slip agent, a nucleating agent, a colorant, an antioxidant, a heat-stabilizer, a light (weather) stabilizer, a thermoplastic resin other than those specified as a component of the present resin composition, and a modifier such as an impact modifier.

Molding

The resin composition to be used in the present invention can be produced by an arbitrary compounding method. The compounding components of the present invention are preferably more effectively dispersed in finely dispersed state, and the total or a part of the components are preferably mixed with each other simultaneously or separately by a mixer such as blender, kneader, Banbury mixer, roll mill or extruder and the mixture is molded in the form of a silicon wafer carrier.

As an alternative method, a composition dry-blended beforehand is homogenized by melting and kneading with a heated extruder, extruded in the form of a thread, cut to desired length and molded in the form of a silicon wafer carrier.

Molding pellets of the resin composition to be used in the present invention can be produced by blending, e.g. dry-blending individual components by conventional method, melting and kneading with a vented twin-screw extruder having a screw diameter of 44 mm at a cylinder temperature of 200 to 280° C., preferably 220 to 250° C., a screw rotational speed of 160 to 300 rpm, and an extrusion rate of 30 to 60 kg/h, cooling the thread extruded through a die and cutting the cooled thread.

The molding of the silicon wafer carrier of the present invention can be carried out by using a general molding machine for thermoplastic resin. The silicon wafer carrier of the present invention can be produced from the above pellets by injection molding with an injection molding machine under an injection pressure of 600 to 1,000 kg/cm² at an injection rate of 60 to 90 cm³/sec.

The ratio of the melt viscosity of the polyether ester amide (b) to the melt viscosity of the polyester (a) is necessary to fall within the range of 0.01 to 1 in the above case. The melt viscosity ratio can be adjusted by controlling the cylinder temperature, the injection rate and the injection pressure.

The silicon wafer carrier of the present invention is required to be molded under a higher pressure at a higher speed compared with the molding conditions of conventional polyesters. For example, in the case of using a Mitsubishi 80MSP Injection Molding Machine, the molding is preferably carried out at a cylinder temperature of 230 to 260° C., a mold temperature of 40 to 80° C., an injection speed of 40 to 60% and an injection pressure of 40 to 60%. The silicon wafer carrier produced under the above molding condition has excellent permanent antistaticity.

The molding under the above conditions forms a polyether ester amide phase having an aspect ratio of 3 or above, a minor diameter of 1 μm or less and a major diameter of 1 μm or above in a polyester phase within the range from the surface of the silicon wafer carrier to the depth of 20 μm, and the obtained silicon wafer carrier has a surface resistivity of $1\times10^{14}$ to $1\times10^{11}$ $\Omega/\square$, preferably $1\times10^{13}$ to $1\times10^{11}$ $\Omega/\square$, more preferably $1\times10^{12}$ to $1\times10^{11}$ $\Omega/\square$.

The silicon wafer carrier of the present invention is imparted with permanent antistaticity by the segregation of the polyether ester amide to the surface of the silicon wafer carrier, causes extremely low migration of metallic impurities to the surface of the silicon wafer carrier by heat-treatment, and does not generate the surface contamination of a silicon wafer by the transfer of contaminant from the carrier.

Such segregation phenomenon and permanent antistaticity are developed in high reproducibility in a silicon wafer carrier composed of a polyester, an alkaline metal and a polyether ester amide satisfying the conditions shown in the present invention. The segregation phenomenon and permanent antistaticity are developed in higher reproducibility in a silicon wafer carrier composed of a polyester, an alkaline metal, a polyether ester amide and a modified polyolefin satisfying the conditions shown in the present invention.

EXAMPLE

The present invention is described by the following Examples.

The evaluation of the characteristics were performed by the following evaluation methods.

(1) Specific Surface Resistance

Specific surface resistance (surface resistivity) was measured by using a super-insulation meter (TOA Electronics Ltd.; SM-10E).

Measurement conditions:
Ambient temperature: 23° C.
Relative humidity: 50% RH
Measuring voltage: 500V.

(2) Static Charge Decay Period

Static charge decay period is the half-decay time measured by an honest meter (Shishido Electrostatic, Ltd.; Static H-0110).

Measurement conditions:
Ambient temperature: 23° C.
Relative humidity: 50% RH
Applied voltage: 10.0 kV.

(3) Extrudability

The aforementioned vented twin-screw extruder having a screw diameter of 44 mm (Japan Steel Works, Ltd., TEX44S-30AW-2V) was used and the extrudability of a resin was evaluated by charging 10 kg of the resin to the extruder.

◯: Extrudable in ordinary state.

×: Unable to take-up with a cutter owing to frequent thread breakage.

(4) Amount of Eluted Alkaline Metal

The evaluation of the elution of alkaline metal was performed by immersing 10 grams of a specimen (a silicon wafer carrier crushed to flakes of 5 mm square) in 80 ml of pure water at 80° C. for 120 minutes and determining the amount of eluted alkaline metal in pure water with an atomic absorption photometer (Hitachi Ltd.; Z8100) after the immersion treatment.

(5) Amount of Generated Volatile Gas

The evaluation of the amount of generated volatile gas was carried out by heating 10 grams of a specimen (a silicon wafer carrier crushed to flakes of 5 mm square) at 150° C. for 60 minutes and determining the amount of generated volatile gas by gas chromatography.

The gas chromatography was performed by using a head-space gas chromatography (Shimadzu Corp.: HS-GC: GC-9A HSS-2A and CR-4A).

The conditions of analysis are shown below.

1) Column
   Silicon 0V-1701, Id 0.25 mm×50 mm, df 0.3 $\mu$m
2) Carrier gas: He 1.5 kg/cm$^2$G
3) Split ratio: Split/column=60/0.75=80
4) Septum purge flow rate: 1.5 ml/min
5) Column INI. Temp: 50° C.
6) Column INI. Time: 2 min
7) Column P. RATE: 10° C./min
8) Column FINE. Temp: 250° C.
9) Column FINE. Time: 10 min
10) INI. Temp: 300° C.
11) DET. RANGE: 10×1
12) CR-4A WIDTH: 5 sec
13) ATTEN: 2
14) MIN. AREA: 100
15) STOP. TM: 33 min
16) SPEED: 10 mm/min (6) Amount of Alkaline Metal Element in Silicon Wafer Carrier The evaluation of the amount of the alkaline metal elements in a silicon wafer carrier was carried out by decomposing 200 mg of a specimen (a silicon wafer carrier crushed to flakes of 5 mm square) in wet state, and determining the alkaline metal by ICP analysis using JY1700L TRACE (Rigaku Inc.).

(7) Tensile Strength

The tensile strength was measured in conformity to ASTM D638.

(8) Heat-deformation Temperature

Heat-deformation temperature was determined by measuring deflection temperature under load in conformity to ASTM D648 (4.6 kg/cm$^2$).

(9) Polymerization of PBT (QK)

The polytetramethylene terephthalate (QK) used in the Examples was prepared by the following method.

Dimethyl terephthalate (3,500 parts), butanediol (2,560 parts), and titanium tetrabutoxide (26 parts) were charged in a reactor and subjected to transesterification reaction.

The components were transferred to a polymerization reactor when the amount of distilled out methanol reached about 85% of the theoretical value, the pressure was gradually lowered and the polymerization reaction was performed at 246° C. under reduced pressure. After the reaction, the content of the reactor was discharged, cooled and pelletized. The pellets had an intrinsic viscosity of 0.69. The pellets were crystallized and subjected to solid-phase polymerization at 190° C. The obtained pellets had an intrinsic viscosity of 0.92 and a terminal carboxyl group content of 3.5 equivalent/ton.

(10) Raw Materials

Various resins and alkaline metal compound used in the Examples are as follows.

PBT (QK)
   Polytetramethylene terephthalate (QK) produced by the above method.

Polyether ester amide (which may be abbreviated as PEEA hereafter)
   Pelestat 6321, product of Sanyo Chemical Industries Ltd.

Alkaline metal compound
   Potassium chloride, product of Wako Pure Chemical Industries, Ltd.

Glycidyl-modified polyolefin acrylic acid ester

BF-7M, product of Sumitomo Chemical Co., Ltd.
A copolymer composed of 64% by weight of ethylene, 6% by weight of glycidyl methacrylate and 30% by weight of methyl acrylate as monomer components.

PBT
  Product of TEIJIN Ltd.; commercial name: C7000
  terminal carboxyl group concentration: 47 equivalent/ton
  intrinsic viscosity: 1.07

PBT
  PBT produced by solution polymerization product of TEIJIN Ltd., commercial name: TRB-J
  terminal carboxyl group concentration: 52 equivalent/ton PBT
  PBT produced by solution polymerization product of TEIJIN Ltd., commercial name: TRB-K
  terminal carboxyl group concentration: 42 equivalent/ton Polypropylene (PP)
  Product of Mitsui Toatsu Chemicals Inc., commercial name: BJS-G

EXAMPLES 1 TO 12

(Molding of Silicon Wafer Carrier and Preparation of Test Pieces (Composition)

A PBT composition containing a polyether ester amide and a modified polyolefin was used in the above examples, and a silicon wafer carrier was molded by the following method.

The raw materials described in the Table 1 were homogeneously dry-blended beforehand at ratios described in the Table 1, and kneaded in molten state with a vented twin-screw extruder having a screw diameter of 44 mm at a cylinder temperature of 180 to 310° C., a screw rotation speed of 160 rpm and an extrusion rate of 40 kg/h. The thread extruded through a die was cooled and cut to obtain pellets for molding.

The pellets were injection-molded under an injection pressure of 750 kg/cm$^2$ at an injection rate of 70 cm$^3$/sec, a cooling time of 15 sec and a total cycle time of 25 sec to obtain a silicon wafer carrier. Test pieces were prepared by cutting the side face of the carrier to prescribed sizes.

The melt viscosity of the polyether ester amide in the molding of the silicon wafer carrier was 65 (Pa·S) at 260° C. and a shearing rate of 1,000 sec$^{-1}$. The ratio of the melt viscosity of the polyether ester amide to that of the polyester was 0.65 (shearing rate: 1,000 sec$^{-1}$) and the cylinder temperature was 250° C.

The melt viscosity ratio in the Table 2 is defined by the following formula.

(Melt viscosity ratio)=(Melt viscosity of PEEA)/(Melt viscosity of PBT)

The measurement of the melt viscosity was carried out at 250° C. and a shearing rate of 1,000 sec$^{-1}$.

EXAMPLE 1

A silicon wafer carrier was molded by the above molding method. The extrudability was good.

A test piece was prepared according to the above method and subjected to the above evaluations. The silicon wafer carrier showed an antistaticity corresponding to the surface resistivity of 10$^{12}$ Ω/□ or below, which is a level unattainable by conventional methods. The results are shown in the Table 1 and the Table 2.

TABLE 1

|  | PBT(QK) (wt. %) | PEEA (wt %) | BF-7M (wt %) | Extrudability |
|---|---|---|---|---|
| Example 1 | 72 | 25 | 3 | ○ |
| Example 2 | 66.5 | 27.5 | 6 | ○ |
| Example 3 | 64 | 30 | 6 | ○ |
| Example 4 | 85 | 15 | 0 | ○ |
| Example 5 | 82 | 18 | 0 | ○ |
| Example 6 | 75 | 25 | 0 | x |
| Example 7 | 72.5 | 27.5 | 0 | x |
| Example 8 | 70 | 30 | 0 | x |
| Example 9 | 100 | 0 | 0 | ○ |

TABLE 2

|  | PBT(QK) (wt %) | PEEA (wt %) | BF-7M (wt %) | Surface resistivity (Ω/□) | Half decay time of static charge (sec) | Melt viscosity ratio |
|---|---|---|---|---|---|---|
| Example 1 | 72 | 25 | 3 | 4.0 E + 11 | 0.5 | 0.65 |
| Example 2 | 66.5 | 27.5 | 6 | 2.0 E + 11 | 0.5 | 0.65 |
| Example 3 | 64 | 30 | 6 | 1.0 E + 11 | 0.5 | 0.65 |
| Example 4 | 85 | 15 | 0 | 4.0 E + 12 | 1.5 | 0.65 |
| Example 5 | 82 | 18 | 0 | 2.0 E + 12 | 0.8 | 0.65 |
| Example 9 | 100 | 0 | 0 | ≧1.0 E + 15 | ≧300 | — |

EXAMPLES 2 AND 3

Silicon wafer carriers were molded, and test pieces were prepared and evaluated similar to the Example 1.

The results are shown in the Table 1 and the Table 2.

EXAMPLES 4 AND 5

Silicon wafer carriers were molded, and test pieces were prepared and evaluated similar to the Example 1. The results are shown in the Table 1 and the Table 2.

These are examples containing 18 to 15% by weight of the polyether ester amide, and the surface resistivity values were 1×10$^{13}$ Ω/□ or below.

EXAMPLES 6 TO 8

These are examples characterized simply by the increased content of polyether ester amide. The take-up of thread was extremely difficult in the extrusion of the molten resin through a die of the twin-screw extruder owing to Barus effect failing in getting resin pellets.

EXAMPLE 9

A silicon wafer carriers was molded, and test pieces were prepared and evaluated similar to the Example 1. The results are shown in the Table 1 and the Table 2. The example is characterized by the exclusive use of PBT, and the resin was extrudable similar to ordinary resins.

EXAMPLES 10 TO 12

Silicon wafer carriers were molded, and test pieces were prepared and evaluated similar to the Example 1. The results are shown in the Table 3.

TABLE 3

|  | PBT (QK) (wt %) | PEEA (wt %) | BF-7M (wt %) | Amount of eluted alkaline metal (ppm) |
|---|---|---|---|---|
| Example 10 | 72 | 25 | 3 | <4 |
| Example 11 | 66.5 | 27.5 | 6 | <4 |
| Example 12 | 85 | 15 | 0 | <4 |

The amount of eluted alkaline metal in a system added with a polyether ester amide and a modified polyolefin was comparable to the amount in the Example containing 15% by weight of a polyether ester amide.

EXAMPLES 13 TO 16
Molding of Silicon Wafer Carrier 2 (Composition)

PBT compositions containing a polyether ester amide were used in these Examples, and silicon wafer carriers were molded by the following method. The test pieces were prepared by the following method.

A polyether ester amide was compounded to a PBT (QK) at ratios shown in the Table 2-1. The components were mixed with each other and kneaded in molten state with an extruder at 260° C., a screw rotational speed of 240 rpm and an extrusion rate of 50 kg/h. The thread extruded through the die was cooled and cut to obtain pellets for molding. Silicon wafer carriers were molded by the injection molding of the pellets under an injection pressure of 750 kg/cm$^2$ at an injection rate of 68 cm$^3$/sec.

Separately, test pieces were produced by the injection molding of the pellets under an injection pressure of 750 kg/cm$^2$, an injection rate of 70 cm$^3$/sec, a cooling time of 15 sec and a total molding cycle of 25 sec.

The melt viscosity ratio in the Table 4 is defined by the following formula.

(Melt viscosity ratio)=(Melt viscosity of PEEA)/(Melt viscosity of PBT)

The measurement of the melt viscosity was carried out at 260° C. and a shearing rate of 1,000 sec$^{-1}$.

EXAMPLE 13

A test piece was prepared by the above method at component ratios described in the Table 4 and evaluated by the above evaluation methods. The result is shown in the Table 4.

TABLE 4

|  | PBT(QK) (wt %) | PEEA (wt %) | Surface resistivity (Ω/□) | Half decay time of static charge (sec) | Melt viscosity ratio |
|---|---|---|---|---|---|
| Example 13 | 85.0 | 15.0 | 2.9 E + 12 | 1.2 | 0.30 |
| Example 14 | 82.0 | 18.0 | 2.0 E + 12 | 0.8 | 0.30 |
| Example 15 | 80.0 | 20.0 | 1.0 E + 12 | 0.6 | 0.30 |
| Example 16 | 100.0 | 0.0 | ≧1.0 E + 15 | 100.0 | — |

EXAMPLES 14 TO 16

Test pieces were prepared by the above method similar to the Example 13 at component ratios described in the Table 4 and the above evaluations were carried out. The results are shown in the Table 4.

EXAMPLE 17

A silicon wafer was produced according to the above method at component ratios similar to the Example 13. A test piece was prepared by cutting the silicon wafer carrier at the part to be brought into contact with a silicon wafer.

The antistaticity of the test piece was evaluated according to the above method, and the half decay time was 3 sec, showing excellent antistatic characteristics as a silicon wafer carrier.

The test piece was heat-treated at 160° C. for 5 hours, and the antistaticity was evaluated in the similar manner to get a half decay time of 2 sec, revealing that excellent antistaticity was maintained after the heat-treatment.

The amount of alkali metal eluted from the silicon wafer carrier was evaluated according to the above method. It was 0.9 ppm, i.e. an extremely low level.

EXAMPLES 18 TO 22
Molding of Silicon Wafer Carrier 3 (Simple PBT)

Exclusively PBT (QK) was used in the Examples 18 to 22, and the silicon wafer carriers were molded by the following method. The test pieces were prepared by the following method.

Molding pellets were produced by melting and kneading PBT (QK) with an extruder at 260° C., a screw rotational speed of 160 rpm and an extrusion rate of 50 kg/h, cooling the thread extruded through a die and cutting the cooled thread.

The molding pellets were injection-molded at a cylinder temperature of 250° C. and a mold temperature of 60° C. to obtain a silicon wafer carrier of 8 inch size. The silicon wafer carrier was crushed to flakes of 5 mm square to obtain a specimen for the analyses of volatile gas and eluted alkaline metal.

Test pieces were produced from the molding pellets by injection molding and used for the evaluation of mechanical strength and heat-resistance (deflection temperature under load).

EXAMPLE 18

A silicon wafer carrier was molded by using PBT (QK) as the PBT.

Specimens for the analyses of volatile gas and eluted alkaline metal were prepared. The amount of generated volatile gas was 3 ppm, and the main component of the volatile gas was THF. The measured result of the eluted alkaline metal was 2.2 ppb or below. The resin exhibited extremely low generation of volatile gas as well as elution of alkaline metal and was excellent as a resin for a silicon wafer carrier.

It had strength and heat-resistance indispensable in a silicon wafer manufacturing process.

The evaluation results are shown in the Table 5.

TABLE 5

|  | Resin (grade) | Tensile strength (Mpa) | Heat distortion temperature (4.6 kg/cm$^2$) | Amount of generated volatile gas (ppm) | Amount of eluted alkaline metal (ppb) |
|---|---|---|---|---|---|
| Example 18 | PBT(QK) | 54.0 | 155.0 | 3.0 | 2.2 |
| Example 19 | PBT(C7000) | 54.0 | 155.0 | 300.0 | 110.0 |
| Example 20 | PP(BJS-G) | 29.0 | 110.0 | 500.0 | 100.0 |

EXAMPLE 19

A silicon wafer carrier was produced and evaluated similar to the Example 18 except for the use of PBT (Teijin Ltd.;

C7000) in place of the PBT (QK) of the Example 18. The results are shown in the Table 5.

EXAMPLE 20

A silicon wafer carrier was produced and evaluated similar to the Example 18 except for the use of polypropylene (Mitsui Toatsu Chemicals Inc.; BJS-G) in place of the PBT (QK) of the Example 18. The results are shown in the Table 5.

EXAMPLE 21

A silicon wafer carrier was produced and evaluated similar to the Example 18 by using PBT (Teijin Ltd.; TRB-J) in place of PBT (QK) of the Example 18. The main component of the volatile gas was THF. The results are shown in the Table 6.

EXAMPLE 22

A silicon wafer carrier was produced and evaluated similar to the Example 18 by using PBT (Teijin Ltd.; TRB-K) in place of PBT (QK) of the Example 18. The main component of the volatile gas was THF. The results are shown in the Table 6.

TABLE 6

| | Resin (grade) | Polymerization process | Amount of generated volatile gas (ppm) | Amount of eluted alkaline metal (ppb) |
|---|---|---|---|---|
| Example 18 | PBT(QK) | Solid-phase polymerization after solution polymerization | 3.0 | 2.2 |
| Example 21 | PBT(TRB-J) | Solution polymerization | 21.0 | 0.0 |
| Example 22 | PBT(TRB-K) | Solution polymerization | 37.4 | 0.0 |

EXAMPLE 23

The amounts of alkaline metal elements existing in the silicon wafer carriers of the Examples 1 to 16 were measured. The results are shown in the Table 7.

TABLE 7

| | PBT(QK) (wt %) | PEEA (wt %) | BF-7M (wt %) | Amount of alkaline metal in silicon wafer carrier (ppm) | Ratio of alkaline metal to PEEA (ppm) |
|---|---|---|---|---|---|
| Example 1 | 72 | 25 | 3 | 249 | 996 |
| Example 2 | 66.5 | 27.5 | 6 | 248 | 902 |
| Example 3 | 64 | 30 | 6 | 282 | 940 |
| Example 4 | 85 | 15 | 0 | 132 | 880 |
| Example 5 | 82 | 18 | 0 | 166 | 922 |
| Example 6 | 75 | 25 | 0 | 233 | 932 |
| Example 7 | 72,5 | 27.5 | 0 | 260 | 945 |
| Example 8 | 70 | 30 | 0 | 297 | 990 |

TABLE 7-continued

| | PBT(QK) (wt %) | PEEA (wt %) | BF-7M (wt %) | Amount of alkaline metal in silicon wafer carrier (ppm) | Ratio of alkaline metal to PEEA (ppm) |
|---|---|---|---|---|---|
| Example 9 | 100 | 0 | 0 | 0 | 0 |
| Example 13 | 85 | 15 | 0 | 134 | 893 |
| Example 14 | 82 | 18 | 0 | 162 | 900 |
| Example 15 | 80 | 20 | 0 | 190 | 950 |
| Example 16 | 100 | 0 | 0 | 0 | 0 |

EXAMPLES 24 TO 28

The following 5 kinds of PEEA were prepared by adjusting the amount of alkaline metal in PEEA with potassium chloride.

PEEA<10: PEEA having an alkaline metal content of less than 10 ppm based on PEEA PEEA120: PEEA having an alkaline metal content of 120 ppm based on PEEA PEEA900: PEEA having an alkaline metal content of 900 ppm based on PEEA PEEA2000: PEEA having an alkaline metal content of 2,000 ppm based on PEEA PEEA3000: PEEA having an alkaline metal content of 3,000 ppm based on PEEA

EXAMPLE 24

A test piece was prepared similar to the Example 13 by using a resin composition containing the above PEEA resins at ratios shown in the Table 8. The units of PBT and PEEA in the Table are wt %.

The Example 24 is a case having an alkaline metal content of less than 10 ppm relative to PEEA, and sufficient antistatic performance was unattainable in this case.

TABLE 8

| | PBT (QK) (wt %) | PEE A <10 (wt %) | PEE A 120 (wt %) | PEE A 900 (wt %) | PEE A 2000 (wt %) | PEE A 3000 (wt %) | Surface resistivity (Ω) | Amount of eluted alkaline metal (ppm) |
|---|---|---|---|---|---|---|---|---|
| Example 24 | 85 | 15 | — | — | — | — | 2.0 E + 14 | <4 |
| Example 25 | 85 | — | 15 | — | — | — | 2.3 E + 13 | <4 |
| Example 26 | 85 | — | — | 15 | — | — | 1.2 E + 12 | <4 |
| Example 27 | 85 | — | — | — | 15 | — | 1.4 E + 12 | <4 |
| Example 28 | 85 | — | — | — | — | 15 | 1.1 E + 12 | >10 |

EXAMPLE 25

A test piece was produced similar to the Example 24.

The amount of eluted metal was small and the test piece exhibited sufficient antistaticity.

EXAMPLE 26

A test piece was produced similar to the Example 24.

The amount of eluted metal was small and the test piece exhibited sufficient antistaticity.

EXAMPLE 27

A test piece was produced similar to the Example 24.

The amount of eluted metal was small and the test piece exhibited sufficient antistaticity.

EXAMPLE 28

A test piece was produced similar to the Example 24.

The content of alkaline metal was 3,000 ppm based on PEEA in the Example 28, and the amount of eluted metal was too large to enable the use of the composition for the production of a silicon wafer carrier.

EFFECT OF THE INVENTION

This invention provides a silicon wafer carrier having high mechanical properties and heat-resistance as well as low generation of volatile gas and elution of metals suppressed to an extent not to essentially cause the surface contamination of a silicon wafer.

This invention also provides a silicon wafer carrier having excellent permanent antistaticity as well as low generation of volatile gas and elution of metals suppressed to an extent not to essentially cause the surface contamination of a silicon wafer.

What is claimed is:

1. A silicon wafer carrier consisting essentially of a polytetramethylene terephthalate formed as said silicon wafer carrier, generating not more than 10 ppm of volatile gas when subjected to a heat-treatment at 150° C. for 60 minutes, and eluting not more than 50 ppb of alkaline metals when immersed in pure water at 80° C. for 120 minutes.

2. A process for preparing a silicon wafer carrier, which comprises:

providing a composition which consists essentially of polytetramethylene terephthalate, and which generates not more than 10 ppm of volatile gas when subjected to a heat-treatment at 150° C. for 60 minutes, and elutes not more than 50 ppb of alkaline metals when immersed in pure water at 80° C. for 120 minutes; and forming said silicon wafer carrier from said composition.

* * * * *